US011510337B2

(12) United States Patent
Ide et al.

(10) Patent No.: US 11,510,337 B2
(45) Date of Patent: Nov. 22, 2022

(54) FAN-EQUIPPED HEATSINK

(71) Applicant: Lotus Thermal Solution Inc., Osaka (JP)

(72) Inventors: Takuya Ide, Osaka (JP); Masaaki Murakami, Osaka (JP); Tomiyuki Numata, Osaka (JP)

(73) Assignee: LOTUS THERMAL SOLUTION INC., Osaka (JP)

( * ) Notice: Subject to any disclaimer, the term of this patent is extended or adjusted under 35 U.S.C. 154(b) by 0 days.

(21) Appl. No.: 17/273,240

(22) PCT Filed: Sep. 4, 2019

(86) PCT No.: PCT/JP2019/034769
§ 371 (c)(1),
(2) Date: Mar. 3, 2021

(87) PCT Pub. No.: WO2020/050313
PCT Pub. Date: Mar. 12, 2020

(65) Prior Publication Data
US 2021/0274679 A1    Sep. 2, 2021

(30) Foreign Application Priority Data
Sep. 5, 2018  (JP) ............................. JP2018-165762

(51) Int. Cl.
*H05K 7/20* (2006.01)
*F04D 29/42* (2006.01)

(52) U.S. Cl.
CPC ..... *H05K 7/20154* (2013.01); *F04D 29/4246* (2013.01); *H05K 7/2039* (2013.01); *F04D 29/4226* (2013.01)

(58) Field of Classification Search
CPC .. F04D 29/4226; F04D 29/4246; F04D 17/08; F04D 29/703; F04D 29/582;
(Continued)

(56) References Cited

U.S. PATENT DOCUMENTS 6,043,980 A * 3/2000 Katsui ................ H01L 23/467
361/679.48
7,697,293 B1 * 4/2010 Peng .................. H01L 23/467
361/689

(Continued)

FOREIGN PATENT DOCUMENTS

JP     H06-117400 A    4/1994
JP     H10-294582 A   11/1998
(Continued)

OTHER PUBLICATIONS

International Search Report for International Application No. PCT/JP2019/034769 dated Nov. 5, 2019 (2 sheets, 2 sheets translation, 4 sheets total).

*Primary Examiner* — Adam B Dravininkas
(74) *Attorney, Agent, or Firm* — Kratz, Quintos & Hanson, LLP

(57) ABSTRACT

A fan-equipped heatsink includes: a heat receiving substrate made of metal; a centrifugal fan disposed on an upper surface side of the heat receiving substrate; a plate-shaped wall that is made of metal, is provided so as to stand at a position, on the upper surface of the heat receiving substrate, which is around and opposed to an outer peripheral portion having an air discharge opening of the centrifugal fan, and are provided with a plurality of through-holes that are open in a plate surface opposed to the centrifugal fan; and a lid member fixed to an upper end of the plate-shaped wall 4 and configured to close a space on the inner side of the plate-shaped wall.

5 Claims, 9 Drawing Sheets

(58) Field of Classification Search
CPC ...... F04D 29/584; F04D 29/526; F04D 25/08; F04D 29/701; H01L 23/367; H01L 23/3675; H01L 23/3736; H01L 23/373; H01L 23/467; H01L 23/36; H05K 7/20145; H05K 7/20409; H05K 7/2039; H05K 7/20418; H05K 7/20181; H05K 7/20154; H05K 7/20136; H05K 5/0217; H05K 9/0007
See application file for complete search history.

(56) References Cited

U.S. PATENT DOCUMENTS

| | | | | |
|---|---|---|---|---|
| 2005/0161199 | A1* | 7/2005 | Ma | H01L 23/467 257/E23.099 |
| 2006/0039117 | A1* | 2/2006 | Lee | H01L 23/467 361/719 |
| 2007/0215336 | A1* | 9/2007 | Hsu | H01L 23/367 257/722 |
| 2010/0232108 | A1* | 9/2010 | Chuang | H01L 23/467 361/697 |

FOREIGN PATENT DOCUMENTS

| | | |
|---|---|---|
| JP | 2002-518861 A | 6/2002 |
| JP | 2005-328011 A | 11/2005 |
| JP | 2006-279004 A | 10/2006 |
| JP | 2007-234957 A | 9/2007 |
| JP | 2018-073869 A | 5/2018 |
| WO | 1999/066776 A1 | 12/1999 |

* cited by examiner

Flow rate distribution at cross section of center of centrifugal fan

FAN-EQUIPPED HEATSINK

TECHNICAL FIELD

The present invention relates to a fan-equipped heatsink, suitable for heat dissipation from components that generate a large amount of heat. The components include a central processing unit (CPU) and an element used in an electronic device such as a computer or a projector, for example.

BACKGROUND ART

In recent years, heat generation amounts of a CPU, an element, and the like in an electronic device have increased, and at the same time, compactness and thinness of a housing have been demanded. In association with this, there is a demand for a heatsink that is compact and that has a high heat dissipation efficiency. As a heatsink having a high heat dissipation efficiency and being able to be made thin, each of Patent Literatures 1 and 2, for example, has proposed a fan-equipped heatsink having reduced thickness and an increased heat dissipation efficiency, by providing heat dissipation fins around a centrifugal fan. Specifically, a plurality of plate-shaped fins are disposed with intervals therebetween in the up-down direction around the centrifugal fan, and air is allowed to pass through the intervals, thereby dissipating heat.

Here, each plate-shaped fin needs to have a predetermined thickness for thermal conduction and strength and the number of plate-shaped fins that can be disposed in the up-down direction is limited. In view of the above, each plate-shaped fin needs to be large and wide for increasing heat dissipation efficiency. Accordingly, even when reduction in thickness can be realized, the occupied area in the lateral direction is increased, and thus increase in size of the housing and weight thereof cannot be avoided. In order to obtain heat dissipation efficiency, it is important to dispose each heat dissipation fin as close as possible to an outer side face, of the centrifugal fan, where a discharge opening is present. Depending on the type of the centrifugal fan, processing of shaping of the portion opposed to the outer side face is required, which may also cause increase in costs.

Further, for quiet rotation of the centrifugal fan, it is important that the flow rate of air passing between the heat dissipation fins is uniform around the centrifugal fan, in addition to a high heat dissipation efficiency even by slow rotation of the centrifugal fan. Specifically, if the flow rate can be made uniform, the heat dissipation effect can be maintained even when the average flow rate is small, and if the average flow rate can be reduced, noise of the fan is also reduced. In a case of a heat dissipation fin having an annular shape in a plan view as in Patent Literature 2, the flow rate can be made uniform. However, in a case of a quadrangle or any other varied form, the flow rate becomes ununiform, which may cause noise or a decreased heat dissipation efficiency. Meanwhile, when the shape of the heat dissipation fin is limited to the annular shape as in Patent Literature 2, a narrow space in the housing of an electronic device cannot be efficiently used. This may cause a problem of a reduced degree of freedom in designing of the housing.

CITATION LIST

Patent Literature

[PTL 1] Japanese Unexamined Patent Application Publication No. 2007-234957
[PTL 2] Japanese Unexamined Patent Application Publication No. 2006-279004

SUMMARY OF THE INVENTION

Problems to be Solved by the Invention

In view of the above-described situation, an object of the present invention is to provide a fan-equipped heatsink: the entirety of which can be made thin and compact; which has high heat dissipation efficiency; which can maintain quietness by inhibiting increase in the number of revolutions of a centrifugal fan; which does not particularly require processing according to the outer shape of a centrifugal fan; which can be realized at low cost; and which can prevent occurrence of noise and decrease in heat dissipation efficiency without particularly limiting the overall shape in a plan view to a circular shape, thereby being able to have a shape according to a space in a housing of an electronic device and maintain the degree of freedom in designing of the housing.

Solution to the Problems

In view of the current situation, the present inventors conducted thorough study and conceived of the following configuration. That is, a plate-shaped wall obtained by cutting a lotus-type porous metal molded body which has been molded according to a metal solidification method and which has a plurality of pores extending in one direction is provided instead of conventionally proposed heat dissipation fins around a centrifugal fan, and air discharged from the centrifugal fan is caused to pass through the pores having a certain air-flow resistance, thereby dissipating heat. In this configuration, even when the outer shape of the entirety of the heatsink including the plate-shaped wall and a heat receiving substrate is not circular in a plan view, the pore-passing flow rate is made uniform around the fan, and occurrence of noise and decrease in heat dissipation efficiency can be prevented. Thus, the heatsink can have various outer shapes, and the limited space in the housing of the electronic device can be efficiently utilized in heat dissipation. In addition, the present inventors found that even a plate-shaped wall not being a lotus-type porous metal molded body but having through-holes similar to the above-described pores produces similar effects, and thus completed the present invention.

That is, the present invention encompasses the following invention.

(1) A fan-equipped heatsink including: a heat receiving substrate that is made of metal, and includes, on a lower surface side thereof, a contact surface to be contacted by a cooling target for receiving heat of the cooling target through the contact surface; a centrifugal fan disposed on an upper surface side, of the heat receiving substrate, which is a side opposite to the contact surface; and a plate-shaped wall that is made of metal; is provided so as to stand at a position on an upper surface of the heat receiving substrate; and is provided with a plurality of through-holes that are open in a plate surface opposed to the centrifugal fan, the position being opposed to an outer peripheral portion having an air discharge opening of the centrifugal fan.

(2) The fan-equipped heatsink according to (1), in which plate-shaped walls including the plate-shaped wall are provided continuously over an entire periphery around the centrifugal fan, or are partially provided, with an interval provided therein, around the centrifugal fan.

(3) The fan-equipped heatsink according to (1) or (2), in which the plate-shaped wall is a plate member formed separately from the heat receiving substrate, and an end surface of the plate member, which is adjacent to a plate surface thereof is joined to the upper surface of the heat receiving substrate, thereby providing the plate-shaped wall so as to stand.

(4) The fan-equipped heatsink according to (3), in which the plate member is obtained by cutting a lotus-type porous metal molded body that has a plurality of pores extending in one direction and that is formed by molding according to a metal solidification method, in a direction crossing the one direction in which the pores extend, and the pores divided by the cutting serve as the through-holes of the plate-shaped wall.

(5) The fan-equipped heatsink according to (4), in which a skin layer in which the pores are not present due to an inner wall of a mold used in the molding is formed in an end portion of the plate member, and the end portion, of the plate member, in which the skin layer is formed is joined to the upper surface of the heat receiving substrate, thereby providing the plate-shaped wall so as to stand.

(6) The fan-equipped heatsink according to any one of (1) to (5), including a lid member fixed to an upper end of the plate-shaped wall and configured to close a space, on an inner side of the plate-shaped wall, in which the centrifugal fan is disposed, the lid member having an air intake hole at a position corresponding to an air intake port of the centrifugal fan.

Advantageous Effects of the Invention

According to the fan-equipped heatsink of the present invention, while air discharged from the centrifugal fan passes through a plurality of through-holes of the plate-shaped wall, heat transferred from the heat receiving substrate to the plate-shaped wall is dissipated into the air. Thus, heat dissipation efficiency can be significantly increased in comparison with a case where air is caused to pass between conventional fins. Therefore, the plate-shaped wall can also be downsized in comparison with conventional heat dissipation fins, and thus the entirety of the heatsink can be made thinner and more compact. In addition, quietness can be maintained with inhibiting increase in the number of revolutions of the centrifugal fan. That is, the heat dissipation efficiency is high, so that the number of revolutions of the fan can be reduced to slow the flow rate. Accordingly, noise can be reduced.

The heat dissipation is performed through the through-holes of the plate-shaped wall. Accordingly, the flow rate through the through-holes becomes uniform around the fan, even when the outer shape of the entirety of the heatsink including the plate-shaped wall and the heat receiving substrate is not circular in a plan view. Therefore, occurrence of noise and decrease in heat dissipation efficiency are prevented. Thus, the heatsink can have various outer shapes, the limited space in the housing of the electronic device can be efficiently utilized in heat dissipation, and the degree of freedom in designing of the housing can be maintained. Further, the heatsink does not particularly require processing according to the outer shape of the centrifugal fan, and thus, can be realized at low cost.

DESCRIPTION OF EMBODIMENTS

Figure 1:
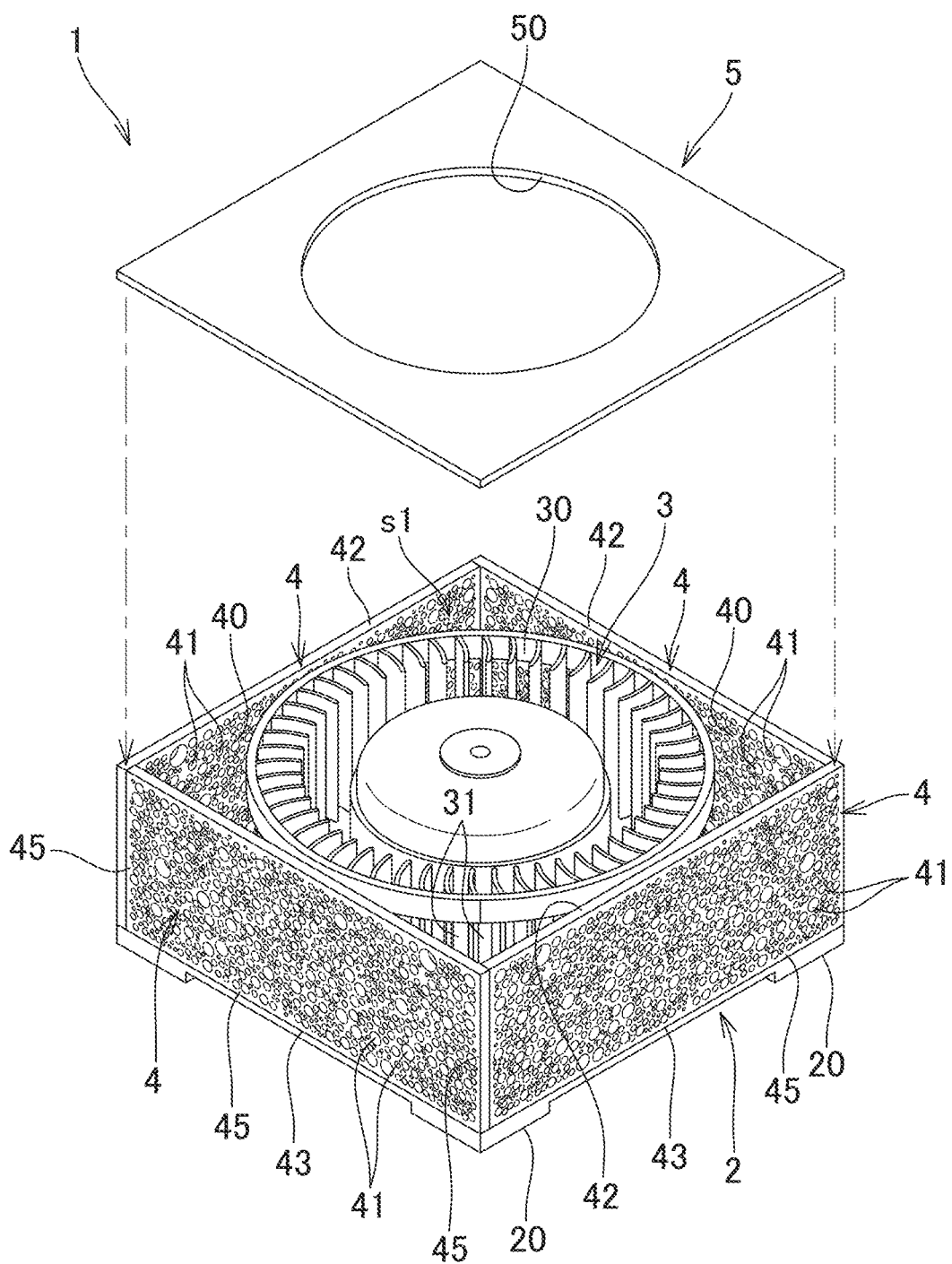
FIG. 1 is an exploded perspective view showing a fan-equipped heatsink according to a representative embodiment of the present invention.
Figure 2:
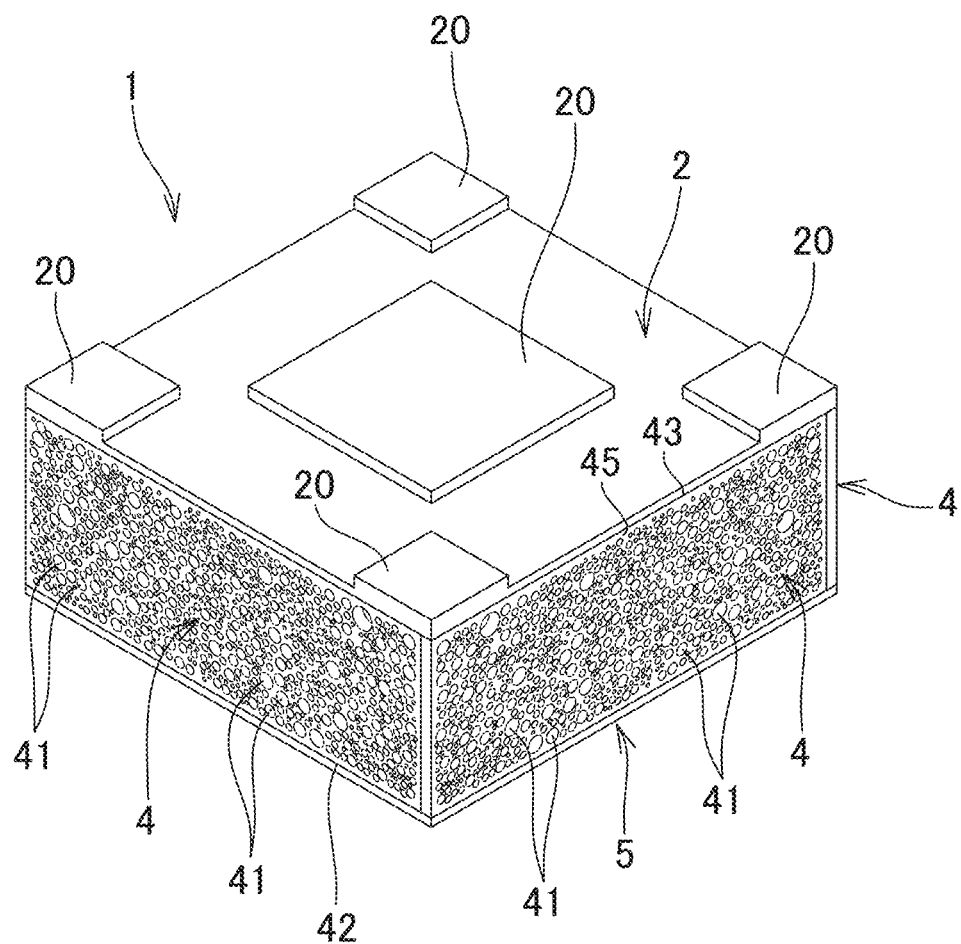
FIG. 2 is a perspective view of the fan-equipped heatsink, viewed from the bottom thereof.
Figure 3:
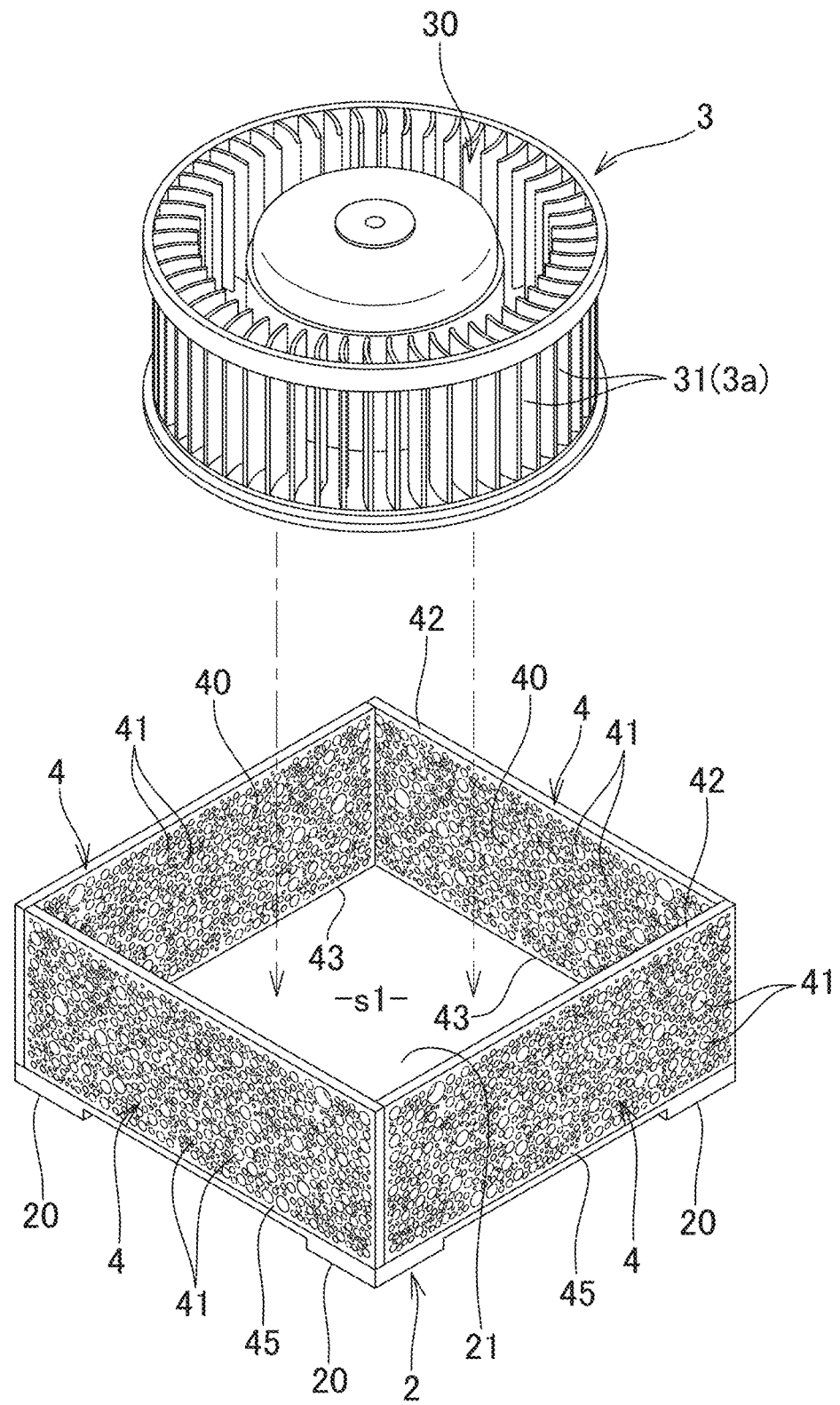
FIG. 3 is an exploded perspective view of the fan-equipped heatsink with a lid member being removed.
Figure 4:
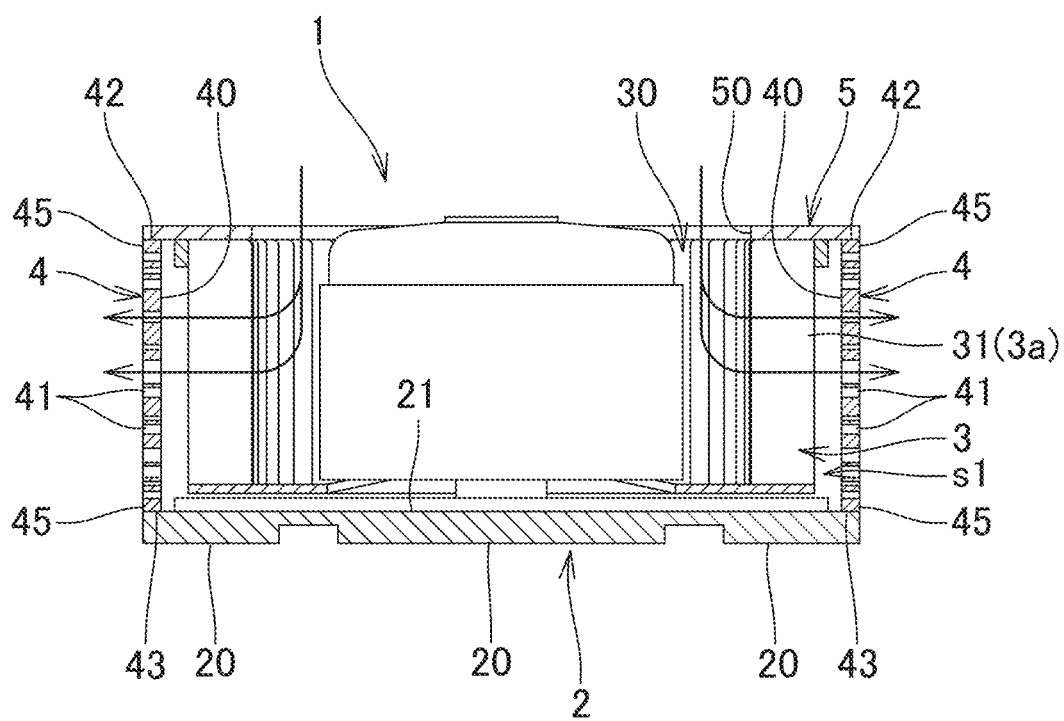
FIG. 4 is a vertical sectional view of the fan-equipped heatsink.

Next, an embodiment of the present invention is described with reference to the attached drawings.

As shown in FIG. 1 to FIG. 4, a fan-equipped heatsink 1 according to a representative embodiment of the present invention includes a heat receiving substrate 2, a centrifugal fan 3, plate-shaped walls 4, and a lid member 5. The heat receiving substrate 2 is made of metal, and includes, on the lower surface side thereof, a contact surface 20 to be contacted by a cooling target (not shown) to receive heat generated therefrom. The centrifugal fan 3 is disposed on an upper surface 21 side, of the heat receiving substrate 2, which is the side opposite to the contact surface 20. The plate-shaped walls 4 are made of metal, and are provided so as to stand at a position, on the upper surface 21 of the heat receiving substrate 2, which is around and opposed to an outer peripheral portion having an air discharge opening of the centrifugal fan 3. Each plate-shaped wall 4 has formed therein a plurality of through-holes 41 that are open in a plate surface 40 opposed to the centrifugal fan 3. The lid member 5 is fixed to an upper end 42 of the plate-shaped wall 4 and closes a space s1, on the inner side of the plate-shaped wall, in which the centrifugal fan 3 is disposed.

The lid member 5 has an air intake hole 50 at a position corresponding to an air intake port 30 of the centrifugal fan 3. As shown with arrows in FIG. 4, external air is forcibly taken in through the air intake hole 50 of the lid member 5 and the air intake port 30 of the centrifugal fan 3. Then, the air is outwardly discharged from the outer circumferential face of the centrifugal fan 3 into the space s1 on the inner side of the plate-shaped wall 4, and then discharged to the outside further through the through-holes 41 of the plate-shaped wall 4. The air from the centrifugal fan 3 is discharged in a direction inclined toward the rotational direction with respect to the radial direction, in accordance with the rotation speed of the centrifugal fan 3.

The air discharged from the centrifugal fan 3 enters the through-holes 41 of the plate-shaped wall 4 while absorbing heat accumulated in the upper surface 21 of the heat receiving substrate 2, the plate surface on the inner side of the plate-shaped wall 4, and the space s1. Then, the air is exhausted to the outside while further absorbing heat of the plate-shaped wall 4 from the inner wall of each through-hole.

That is, the plate-shaped wall 4 is a heat dissipation wall, and the heal receiving substrate 2 and the plate-shaped wall 4 form a heatsink which dissipates heat into air. Since heat is dissipated into air during a process in which the air passes through a plurality of through-holes 41 of the plate-shaped wall 4, heat dissipation efficiency can be significantly increased in comparison with a conventional case where air is caused to pass between fins. That is, due to the presence of the plurality of through-holes 41, the air contact area per unit volume can be increased by several-ten fold, in comparison with the case where ordinary heat dissipation fins are used, and thus heat dissipation effect can be significantly increased. Therefore, the plate-shaped wall can be downsized in comparison with conventional heat dissipation fins, the entirety of the heatsink can be made thinner and more compact, and quietness can be maintained without increasing the number of revolutions of the centrifugal fan 3.

The heat receiving substrate 2 is in a shape of a solid flat plate made of metal. However, the present invention is not limited to this configuration in any degree. A heat receiving substrate 2 in a convex lens shape such that heat transfer resistance is reduced from a center portion toward an end portion is also preferable. Further, the heat receiving substrate 2 may be hollow instead of solid, and it is also preferable that a hollow portion is formed into a heat pipe. As the material, those used for a conventional heatsink, such as aluminum, iron, and copper, can be widely used.

In the present example, the heat receiving substrate 2 is formed in a rectangle shape in a plan view, and the contact surface 20 protruding in a block shape is formed in each of a center portion and four corner portions of the lower surface of the heat receiving substrate 2. Such a contact surface can be set to have a shape that allows close contact with the cooling target in accordance with a to-be-attached surface of the cooling target. A known thermal grease (thermal conduction grease) excellent in thermal conduction is preferably interposed between the contact surface 20 and the cooling target, as appropriate.

As the centrifugal fan 3, those appropriate for conditions of an air volume, dimensions, and the like, such as a sirocco fan and a turbofan, can be widely adopted in accordance with the cooling target, the mounting environment, and the like. The centrifugal fan 3 is mounted to the upper surface 21 of the heat receiving substrate 2 with an adhesive, a screw, or the like. A high temperature of a fan motor of the centrifugal fan 3 due to reception of heat from the heart receiving substrate 2 may cause decrease in the life of the fan. In such a case, it is also desirable to provide a spacer member having a lower thermal conductivity than the heat receiving substrate 2, between the fan motor and the heat receiving substrate 2, thereby making it difficult to transfer heat from the heat receiving substrate 2 to the fan motor.

Each plate-shaped wall 4 is a plate member formed separately from the heat receiving substrate 2. As the metal material forming the plate-shaped wall 4, those used for a plate-shaped fin of a conventional heatsink, such as aluminum, iron, and copper, can be widely used, as in the case of the heat receiving substrate 2. The plate-shaped wall 4 is provided so as to stand by joining an end surface 43 adjacent to the plate surface of the plate member to the upper surface 21 of the heat receiving substrate 2. As a joining method, a known method for joining metals, such as brazing or caulking, can be used. Although the plate-shaped wall 4 of the present example is formed separately from the heat receiving substrate 2, it is understood that the plate-shaped wall 4 may be formed integrally with the heat receiving substrate 2 by use of a mold or the like. In this case, after being integrally formed, the plate-shaped wall may be subjected to through-hole boring processing.

In the present example, the above-described plate member forming the plate-shaped wall 4 is obtained by cutting a lotus-type porous metal molded body that has a plurality of pores extending in one direction and that has been molded according to a metal solidification method, in a direction crossing the direction in which the pores extend. The lotus-type porous metal molded body can be molded according to a known method such as a pressurized gas method (e.g., a method disclosed in Japanese Patent No. 4235813) or a thermal decomposition method. The pores divided by the cutting serve as the through-holes 41 of the plate-shaped wall 4.

The metal plate-shaped wall 4 having the through-holes 41 can be easily provided at low cost by using the plate member cut out from the lotus-type porous metal molded body. In addition, a skin layer 45 in which the pores are not present due to an inner wall of a mold used in the molding is formed in a peripheral end portion of each plate member cut out from the lotus-type porous metal molded body. The end portion (end surface 43), of the plate member, in which the skin layer 45 is formed is joined to the upper surface 21 of the heat receiving substrate 2 so that the plate member stands, whereby the joining area between the end surface 43 and the upper surface 21 of the heat receiving substrate is ensured, and sufficient joining strength can be maintained. In addition, heat transfer from the heat receiving substrate 2 to the plate member (the plate-shaped wall 4) can be efficiently performed, and thus heat dissipation efficiency can be further improved.

The plate thickness, shape (fixed plate thickness/variation in tapered shape, etc.), and size of the plate-shaped wall 4, the axial direction (presence/absence and direction of inclination with respect to the normal line of the plate surface 40), diameter (average), number per unit area, and opening rate (porosity) of the through-holes 41, and the like can be set to appropriate values in consideration of thermal design, noise, and the like. When air enters a through-hole 41, the flow rate is increased, and when air goes out from the through-hole 41, the flow rate is decreased. When the flow rate rapidly changes, a Karman vortex microscopically occurs in most cases, causing noise. With this being taken into consideration together with thermal design, appropriate values can be set.

In particular, the axial direction of each through-hole 41 is preferably set to a direction inclined in the same direction as the rotational direction of the fan with respect to the normal line of the plate surface 40 since noise can be further reduced. The through-hole 41 may be bored by machining such as drilling.

The lid member 5 is adhered to the upper end 42 of each plate-shaped wall 4 to close the space s1 on the inner side of the plate-shaped walls 4, thereby preventing leakage of air and allowing efficient intake of air into the air intake port 30 of the centrifugal fan 3. A low-cost synthetic resin molded article having a light weight can be used as the lid member 5. It is understood that the lid member 5 may be formed of a material other than the above. The lid member 5 may be made of metal and form a heatsink that dissipates heat transferred from the plate-shaped wall 4.

Figure 5:
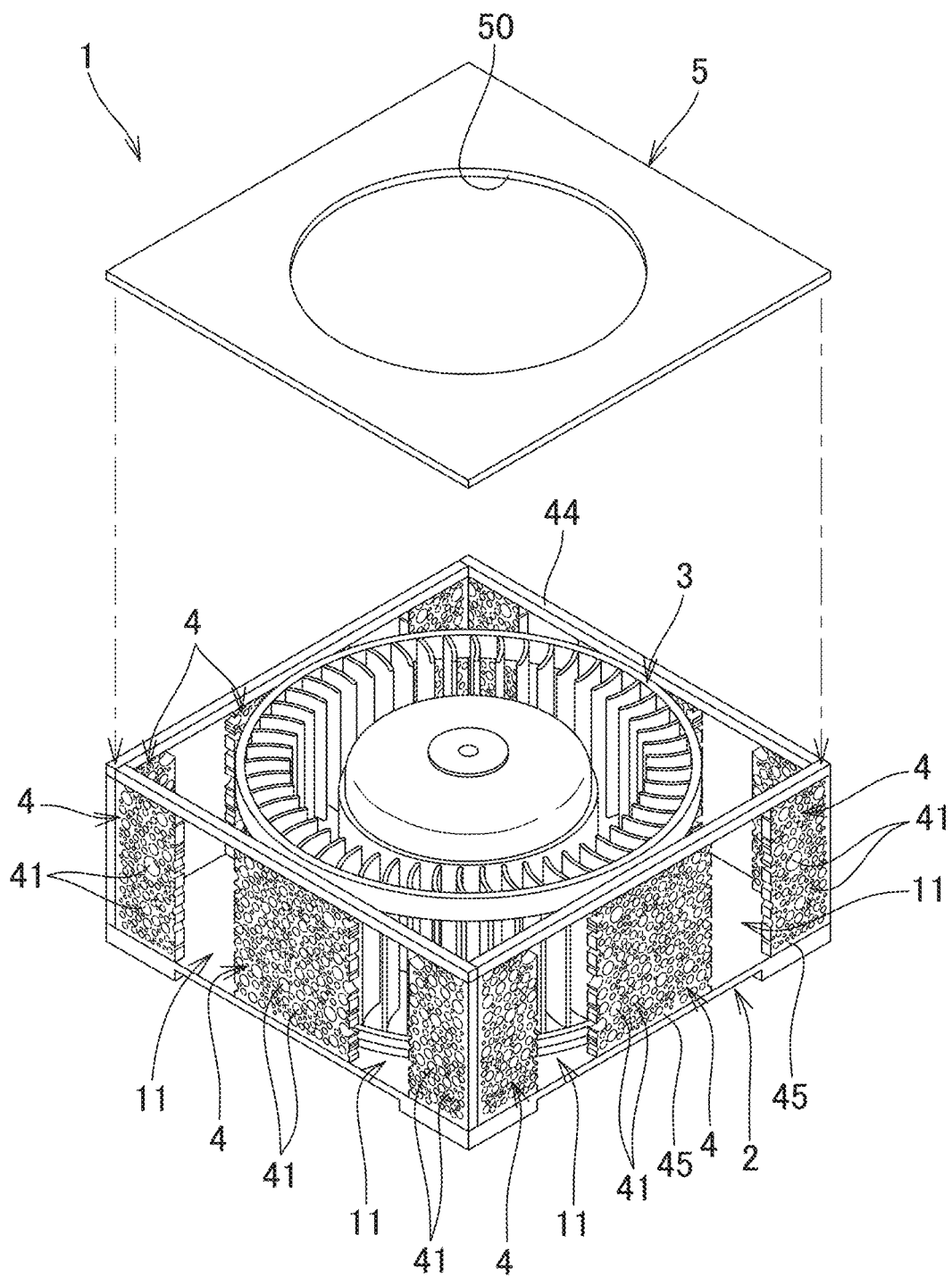
FIG. 5 is an exploded perspective view showing a modification of the fan-equipped heatsink.

FIG. 5 shows a modification in which the plate-shaped walls 4 are intermittently provided with an interval (gap 11) interposed therebetween around the centrifugal fan 3. Thus, in the present invention, it is not necessary to continuously provide the plate-shaped walls 4 in the entire periphery of the centrifugal fan 3 as in the representative example in FIG. 1 to FIG. 4. The present invention also includes a configuration in which the plate-shaped walls 4 are partially provided as in FIG. 5.

When the gaps 11 are provided, heat transferred from the heat receiving substrate 2 to the plate-shaped walls 4 is dissipated by an air flow through the through-holes 41 as described above, and relatively cool air that does not pass through the through-holes 41 is discharged from the gaps 11, whereby the cool air can be supplied to surrounding portions so as to cool them, More specifically, in a case where a cooling target such as, for example, a CPU in the housing of an electronic device, is to be cooled by the present heatsink, small electronic components, etc. that require cooling are also present other than the target. Therefore, the gaps 11 where the plate-shaped wall 4 is not present are provided as in the present example, so that cool air can be sent to spots for such components.

In the present example, in order to stably hold the plate-shaped walls 4 that stand with the intervals therebetween as shown in FIG. 5, a holding frame 44 which couples the upper ends of the plate-shaped walls 4 is provided. Instead of forming the gaps 11 by providing the plate-shaped walls 4 so as to stand with the intervals therebetween, cut-outs or holes larger than the through-holes for heat dissipation may be provided in a part of a single plate-shaped wall 4, thereby forming gaps or openings that are similar to the gaps 11 and that allow cool air to pass as is.

Figure 6:
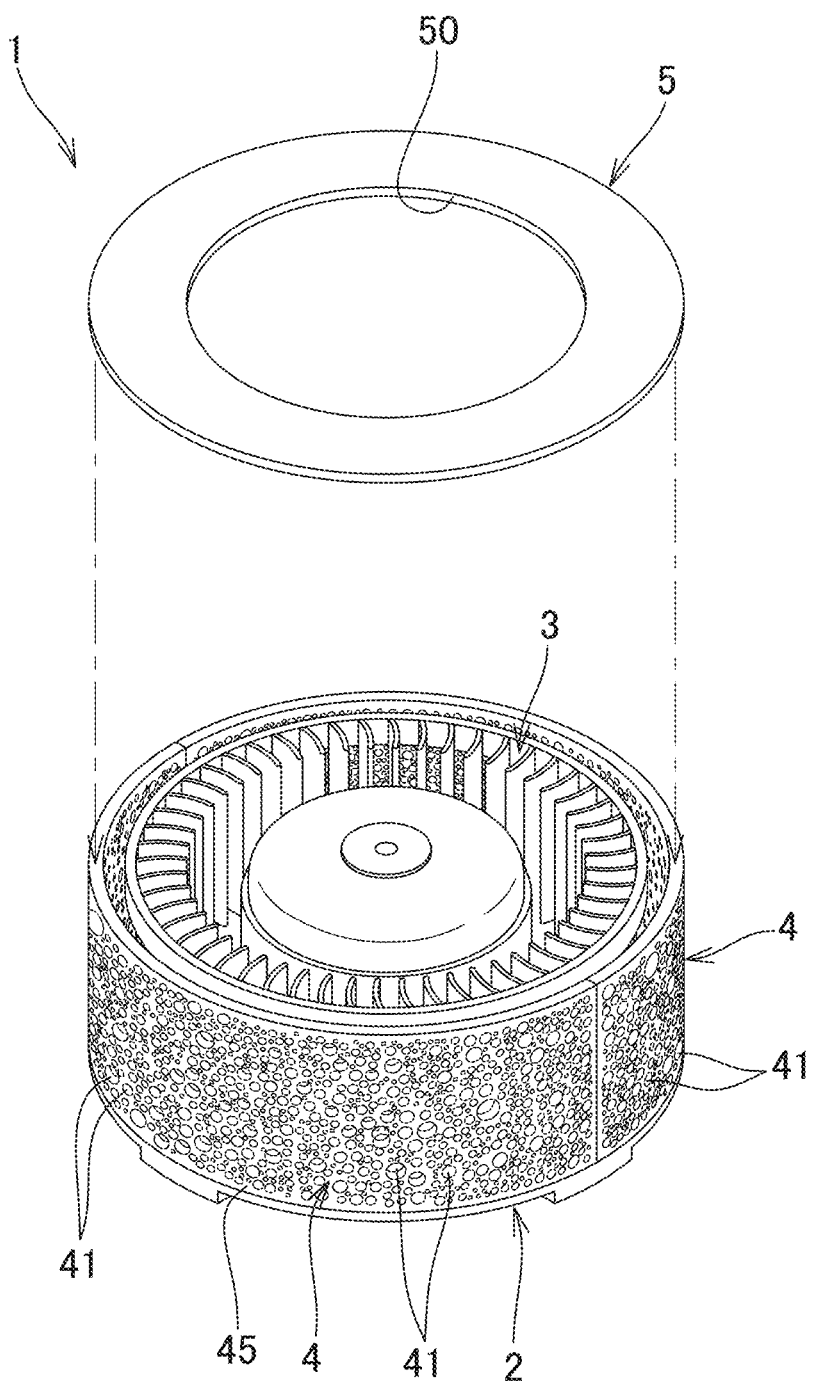
FIG. 6 is an exploded perspective view showing another modification of the fan-equipped heatsink.
Figure 7:
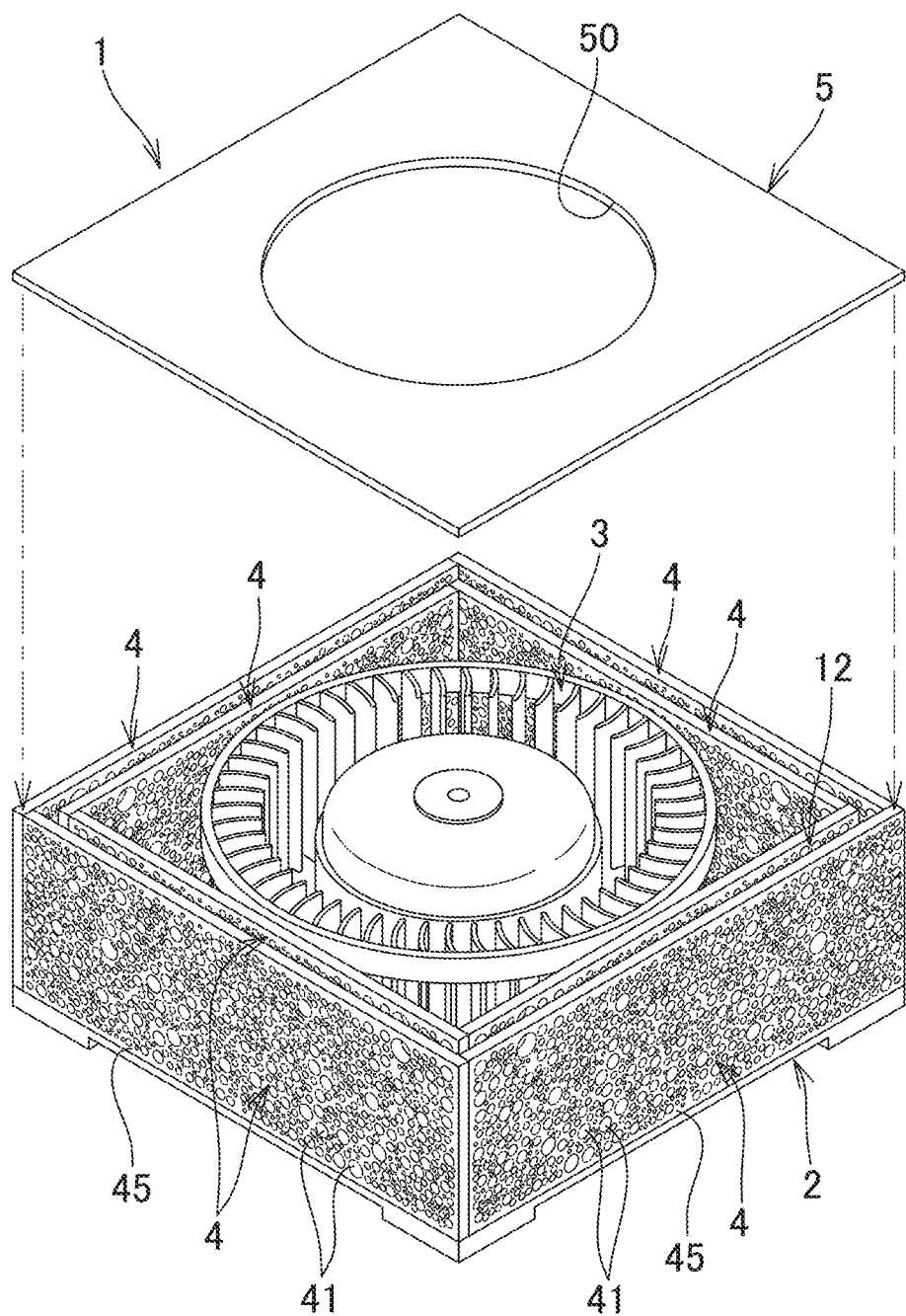
FIG. 7 is an exploded perspective view of still another modification of the fan-equipped heatsink.

FIG. 6 shows a modification in which the outer shape of the heatsink including the plate-shaped wall 4 is circular in a plan view. The outer shape of the heatsink may not necessarily be rectangular in a plan view, and may be circular as in the present example, polygonal, or of a varied shape. Such a circular shape or other shape can be easily formed simply by curving the plate member. FIG. 7 shows a modification in which the plate-shaped walls 4 are provided so as to form double, or triple or more walls with a gap 12 therebetween in the radial direction (inner side and outer side). Accordingly, heat dissipation effect can be easily increased.

The above modifications may be combined together to realize various implementations. That is, although not shown, one or both of the inner and outer walls of double plate-shaped walls may be provided as a wall that is intermittent in the peripheral direction, thereby being able to supply relatively cool air to the surrounding. For example, both of the inner and outer walls may be provided as intermittent plate-shaped walls, and the positions of the plate-shaped walls may be se in a staggered manner in the peripheral direction such that the plate-shaped walls alternately stand.

The embodiment and modifications of the present invention have been described above. However, the present invention is not limited to the embodiment and modifications, and can be implemented, as a matter of course, in various forms without departing from the gist of the present invention.

EXAMPLE

Using a calculation simulation and using the fan-equipped heatsink in the representative embodiment shown in FIG. 1 to FIG. 4 as a model, the pore-passing flow rate around the fan was analyzed and confirmed to be uniform even when the outer shape of the entirety of the heatsink including the plate-shaped walls and the heat receiving substrate was not circular in a plan view. In the following, a result of the analysis is described.

(Analysis Model)

Figure 8:
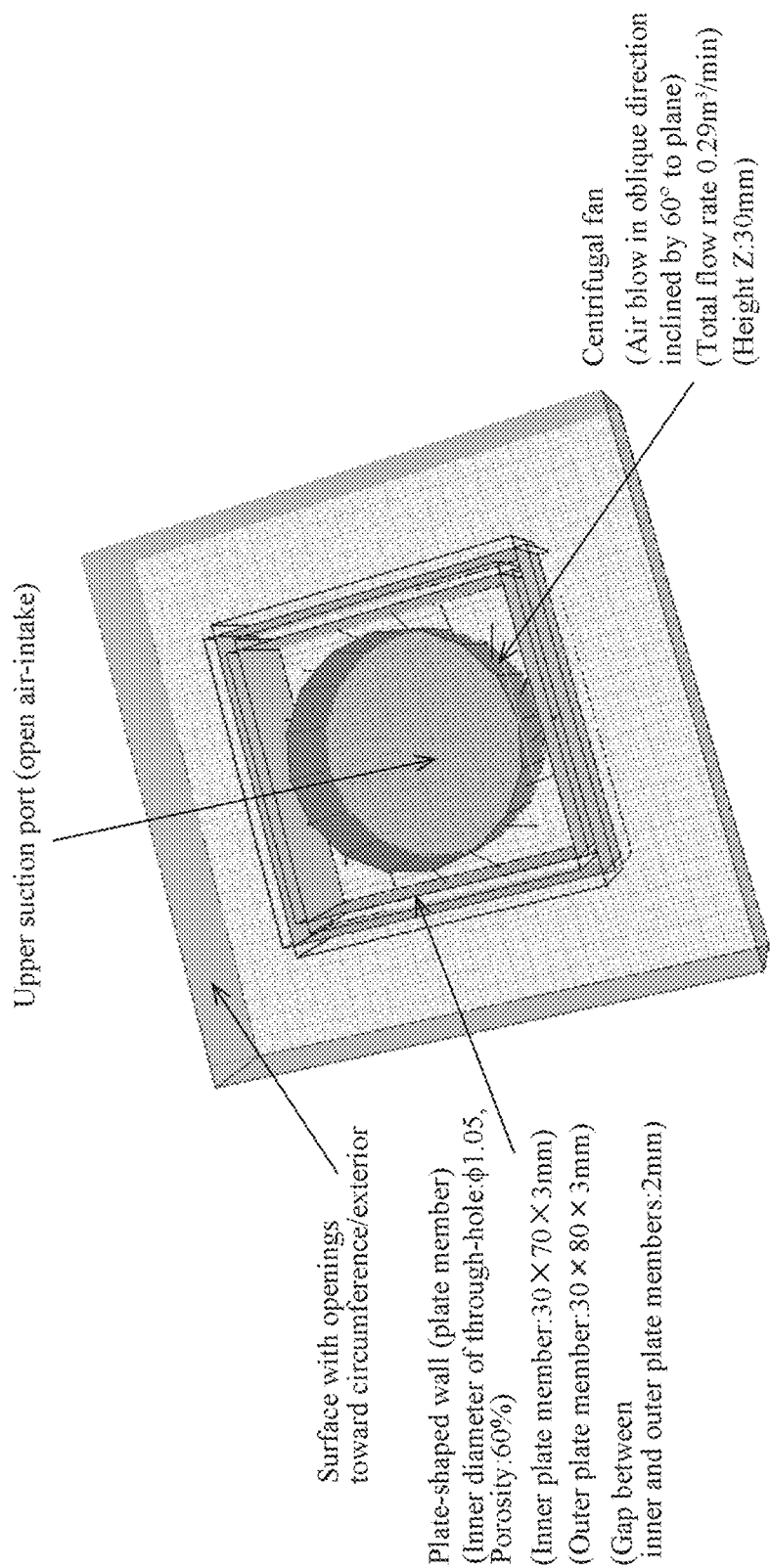
FIG. 8 shows an analysis model used in a calculation simulation in Example.

A model shown in FIG. 8 was used.

A lid member (not shown) having an open upper suction port was used to close the model.

Inner diameter of upper suction port (air intake hole): ϕ60 mm

Plate-shaped wall (plate member):

Inner: four plate members of 30 mm (height:vertical)×70 mm (length)×3 mm (thickness)

Outer: four plate members of 30 mm (height:vertical)×80 mm (length)×3 mm (thickness)

Gap between inner and outer plate members: 2 mm

Inner diameter (average) of through-hole: ϕ1.05 mm, porosity 60%

Centrifugal fan: air was assumed to be discharged through air outlets provided as 16 equal divisions, from respective planes of a right hexadecagon. The discharge direction from each plane was assumed to be inclined toward the rotational direction due to rotation. Specifically, air was assumed to blow out in an oblique direction inclined by 30° toward the rotational direction with respect to the normal line direction of the plane.

(Calculation Simulation Software)

"Flow Designer 2018" manufactured by Advanced Knowledge Laboratory Inc. was used.

(Analysis Result)

Figure 9:
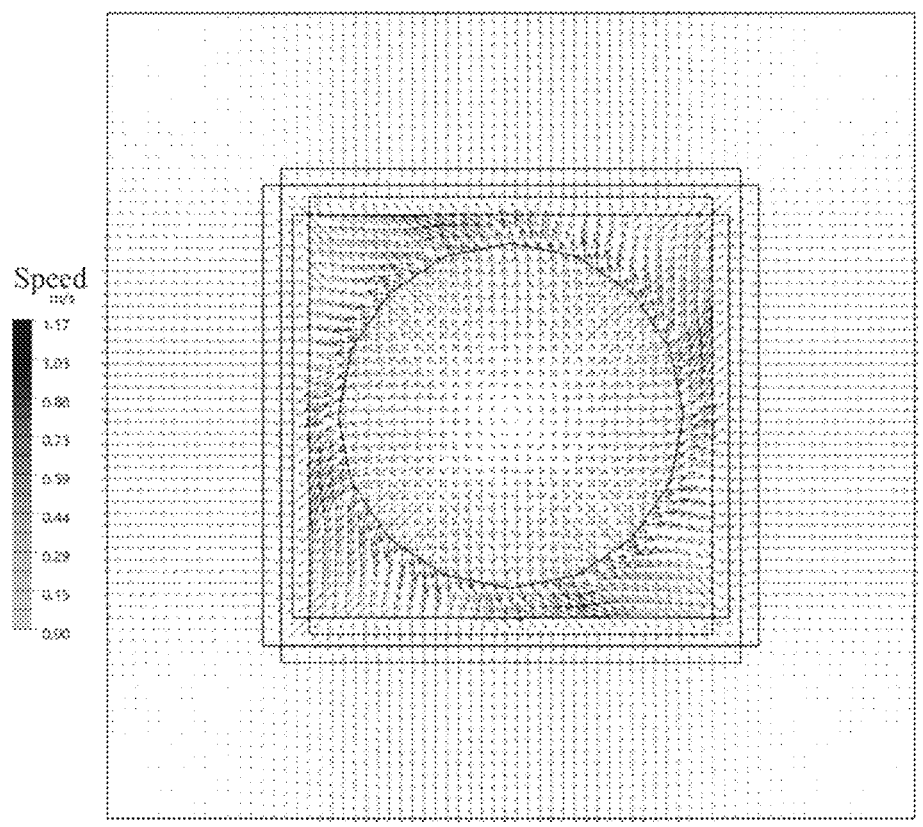
FIG. 9 shows an analysis result in Example.

As shown in FIG. 9, substantially uniform pore-passing flow rates were obtained.

(Discussion)

The flow rate is decreased as the flow from the centrifugal fan is farther from the outer circumference of the fan, since the space becomes greater. In a case of a quadrangular shape in a plan view as in the present model, the flow rate is large at each side portion (near the center position of each plate-shaped wall) that is relatively close to the centrifugal fan, whereas the flow rate at each corner portion is smaller than that at the side portion. However, at the corner portion, air is sent, to the corner portion as if through a fluid funnel. As a result, air having a greater flow rate than the flow rate in an infinite space can be caused to flow into the pores. That is, similar pore-passing flow rates can be obtained at both the side portions and corner portions. This result shows that the pore-passing flow rate can be made uniform, even when the fan-equipped heatsink has various shapes according to the device to which the fan-equipped cl is installed, and thus heat dissipation efficiency can be improved.

DESCRIPTION OF THE REFERENCE CHARACTERS

1 heatsink
2 heat receiving substrate
3 centrifugal fan
4 plate-shaped wall
5 lid member
11 gap
12 gap
20 contact surface
21 upper surface
30 air intake port
40 plate surface
41 through-hole
42 upper end
43 end surface
44 holding frame
45 skin layer
50 air intake hole
s1 space

The invention claimed is:

1. A fan-equipped heatsink comprising:
a heat receiving substrate that is made of metal, and includes, on a lower surface side thereof, a contact surface to be contacted by a cooling target for receiving heat of the cooling target through the contact surface;

a centrifugal fan disposed on an upper surface side, of the heat receiving substrate, which is a side opposite to the contact surface; and a plate-shaped wall that is made of metal; is provided so as to stand at a position on an upper surface of the heat receiving substrate; and is provided with a plurality of through-holes that are open in a plate surface opposed to the centrifugal fan, the position being opposed to an outer peripheral portion having an air discharge opening of the centrifugal fan, wherein the plate-shaped wall is a plate member formed separately from the heat receiving substrate, and an end surface of the plate member, which is adjacent to a plate surface thereof is joined to the upper surface of the heat receiving substrate, thereby providing the plate-shaped wall so as to stand.

2. The fan-equipped heatsink according to claim 1, wherein plate-shaped walls including the plate-shaped wall are provided continuously over an entire periphery around the centrifugal fan, or are partially provided, with an interval provided therein, around the centrifugal fan.

3. The fan-equipped heatsink according to claim 1, wherein the plate member is obtained by cutting a lotus-type porous metal molded body that has a plurality of pores extending in one direction and that is formed by molding according to a metal solidification method, in a direction crossing the one direction in which the pores extend, and the pores divided by the cutting serve as the through-holes of the plate-shaped wall.

4. The fan-equipped heatsink according to claim 3, wherein a skin layer in which the pores are not present due to an inner wall of a mold used in the molding is formed in an end portion of the plate member, and the end portion, of the plate member, in which the skin layer is formed is joined to the upper surface of the heat receiving substrate, thereby providing the plate-shaped wall so as to stand.

5. The fan-equipped heatsink according to claim 1, comprising a lid member fixed to an upper end of the plate-shaped wall and configured to close a space, on an inner side of the plate-shaped wall, in which the centrifugal fan is disposed, the lid member having an air intake hole at a position corresponding to an air intake port of the centrifugal fan.

* * * * *